(12) United States Patent
Sharma et al.

(10) Patent No.: US 11,322,545 B2
(45) Date of Patent: May 3, 2022

(54) VERTICAL JFET DEVICE FOR MEMRISTOR ARRAY INTERFACE

(71) Applicant: HEWLETT PACKARD ENTERPRISE DEVELOPMENT LP, Houston, TX (US)

(72) Inventors: Amit S. Sharma, Milpitas, CA (US); John Paul Strachan, Milpitas, CA (US); Martin Foltin, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 17/041,382

(22) PCT Filed: Apr. 27, 2018

(86) PCT No.: PCT/US2018/029902
§ 371 (c)(1),
(2) Date: Sep. 24, 2020

(87) PCT Pub. No.: WO2019/209330
PCT Pub. Date: Oct. 31, 2019

(65) Prior Publication Data
US 2021/0036058 A1 Feb. 4, 2021

(51) Int. Cl.
*H01L 29/66* (2006.01)
*H01L 21/02* (2006.01)
(Continued)

(52) U.S. Cl.
CPC .... *H01L 27/2454* (2013.01); *H01L 21/02532* (2013.01); *H01L 27/2463* (2013.01);
(Continued)

(58) Field of Classification Search
CPC ............... H01L 27/1159; H01L 29/516; H01L 29/6684; H01L 29/78391
(Continued)

(56) References Cited

U.S. PATENT DOCUMENTS 5,285,081 A   2/1994 Ando
5,432,377 A   7/1995 Litwin
(Continued)

FOREIGN PATENT DOCUMENTS

KR   1020070091162 A   9/2007

OTHER PUBLICATIONS

International Search Report and Written Opinion received for PCT Application No. PCT/US2018/029902, dated Feb. 1, 2019, 8 pages.
(Continued)

*Primary Examiner* — Sheikh Maruf
(74) *Attorney, Agent, or Firm* — McDermott Will & Emery

(57) ABSTRACT

Devices and methods are provided. In one aspect, a device for driving a memristor array includes a substrate including a well having a bottom layer, a first wall and a second wall. The substrate is formed of a strained layer of a first semiconductor material. A vertical JFET is formed in the well. The vertical JFET includes a vertical gate region formed in a middle portion of the well with a gate region height less than a depth of the well. A channel region is formed of an epitaxial layer of a second semiconductor wrapped around the vertical gate region. Vertical source regions are formed on both sides of a first end of the vertical gate region, and vertical drain regions are formed on both sides of a second end of the vertical gate region.

12 Claims, 10 Drawing Sheets

(51) Int. Cl.
  *H01L 27/24* (2006.01)
  *H01L 29/161* (2006.01)
  *H01L 29/808* (2006.01)

(52) U.S. Cl.
  CPC ...... *H01L 29/161* (2013.01); *H01L 29/66909* (2013.01); *H01L 29/8083* (2013.01)

(58) Field of Classification Search
  USPC .......................................................... 257/5
  See application file for complete search history.

(56) References Cited

U.S. PATENT DOCUMENTS

| | | | |
|---|---|---|---|
| 5,945,699 | A | 8/1999 | Young |
| 7,547,617 | B2 | 6/2009 | Ramaswamy et al. |
| 8,723,252 | B2 | 5/2014 | Sandhu et al. |
| 9,276,092 | B1* | 3/2016 | Karda ............... H01L 29/66969 |
| 9,666,641 | B2 | 5/2017 | Zhang |
| 9,806,736 | B2 | 10/2017 | Buchanan |
| 10,497,867 | B1* | 12/2019 | Trinh .................. H01L 45/1233 |
| 10,854,588 | B2* | 12/2020 | Toyoda ................... H02P 27/06 |
| 2006/0049435 | A1 | 3/2006 | Bill et al. |
| 2011/0169136 | A1 | 7/2011 | Pickett et al. |
| 2012/0120709 | A1* | 5/2012 | Mihnea ................ G11C 13/003 365/148 |
| 2013/0193399 | A1* | 8/2013 | Franca-Neto ....... H01L 27/2436 257/5 |
| 2014/0191178 | A1* | 7/2014 | Boivin .............. H01L 29/40117 257/2 |
| 2015/0255717 | A1* | 9/2015 | Park .................... G11C 13/0011 438/382 |
| 2015/0372058 | A1* | 12/2015 | Park .................. H01L 21/02532 438/238 |
| 2017/0373247 | A1* | 12/2017 | Karda ............... H01L 29/66969 |
| 2019/0058008 | A1* | 2/2019 | Yagishita ............ H01L 27/2454 |
| 2021/0249525 | A1* | 8/2021 | Kim .................. H01L 21/02057 |
| 2021/0265500 | A1* | 8/2021 | Tang .................... H01L 23/528 |
| 2021/0391386 | A1* | 12/2021 | Beery ............... H01L 29/66522 |

OTHER PUBLICATIONS

Kim, B. et al., "Voltage Controlled Equivalent Circuit of a Nanowire Memristor," Journal of the Korean Physical Society, Dec. 2015, pp. 1930-1936, vol. 67, No. 11, https://link.springer.com/article/10.3938/jkps.67.1930.

* cited by examiner

VERTICAL JFET DEVICE FOR MEMRISTOR ARRAY INTERFACE

TECHNICAL FIELD

The present disclosure generally relates to integrated circuits, and more specifically relates to a vertical junction filed-effect transistor (JFET) device for a memristor array interface.

BACKGROUND

The design of electronic circuits for switching memristor devices in an array is confronted by challenges including driving sufficient voltage and current to switch target devices, and minimizing a planar area footprint of required large drive transistors. These challenges are potentially more severe when using memristors for dot-product engines within deep learning neural network processors due to the use of the modest array sizes, massive numbers of instantiations of these medium sized arrays, and a need for greater separation of terminal high-resistance states (HRS) and low-resistance states (LRS) in multiple state cells. The above concerns can be addressed by using semiconductor device properties that are present due to field effect near junctions and metal interfaces.

The description provided in the background section should not be assumed to be prior art merely because it is mentioned in or associated with the background section. The background section may include information that describes one or more aspects of the subject technology.

SUMMARY

The subject technology discloses driver devices for a memristor array based on a junction field-effect transistor (JFET). The disclosed driver devices provide sufficient switching voltage and current for the memristor array elements. The driver devices of the subject technology further create a breakthrough in planar area footprint of the driver device by using a vertical instantiation of the JFET. The disclosed driver device has a U-shaped epitaxial channel that wraps around the gate region, which is a vertical gate region. This is an advantageous feature as a longer channel width is provided without leading into a larger planar surface area for each driver device. The longer channel width allows the driver device to provide high conductance and thus reduced voltage drop across the device. The ability to thus provide higher resultant memristor voltage and current for switching by a driver device is a critical requirement for many memristor based applications. The current vertical JFET drivers are not seen to have this advantageous feature of the subject technology.

According to certain aspects of the present disclosure, a device for driving a memristor array includes a substrate including a well having a bottom layer, a first wall and a second wall. The substrate is formed of a strained layer of a first semiconductor material. A vertical JFET is formed in the well. The vertical JFET includes a vertical gate region formed in a middle portion of the well with a gate region height less than a depth of the well. A channel region is formed of an epitaxial layer of a second semiconductor wrapped around the vertical gate region. Vertical source regions are formed on both sides of a first end of the vertical gate region, and vertical drain regions are formed on both sides of a second end of the vertical gate region.

According to certain aspects of the present disclosure, an apparatus includes a memristor array comprising a plurality of memristor elements arranged in rows and columns and a plurality of driver devices to switch the plurality of memristor elements. Each driver device includes a vertical JFET including a vertical gate region, a channel region, and vertical source and drain regions. The vertical gate region is formed within a well and has a gate region height less than a depth of the well. The channel region is formed of a U-shaped epitaxial layer of a second semiconductor wrapped around the vertical gate region. The vertical source regions are formed on both sides of a first end of the vertical gate region, and the vertical drain regions are formed on both sides of a second end of the vertical gate region.

According to certain aspects of the present disclosure, a method of fabrication of a vertical JFET includes forming a strained layer of a first semiconductor material. The method further includes removing a portion of the first semiconductor material to form a well having a bottom layer, a first wall and a second wall. An epitaxial layer of a second semiconductor is grown to form a channel region. A vertical gate region is formed in a middle portion of the well. Vertical source columns are formed on both sides of a first end of the vertical gate region, and vertical drain columns are formed on both sides of a second end of the vertical gate region. Forming the vertical gate region includes forming a vertical plate having a height less than a depth of the well and leaving a layer of channel region between the vertical gate region and the bottom layer.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

The subject technology is directed to a vertical JFET driver device for a memristor array. The disclosed vertical JFET driver comprises a vertical gate plate in parallel with two vertical drain and two vertical source regions formed in a channel region. The channel region is formed by filling a well formed in a substrate with an epitaxial silicon substrate. In some implementations, the substrate can be a strained silicon-germanium substrate and the well is formed by removing a portion of the substrate and leaving a first wall and a second wall and a bottom layer. The vertical gate plate is formed of a p+ doped silicon and does not touch the substrate bottom layer to allow a U-shaped channel underneath and around the vertical gate plate.

The U-shaped epitaxial channel of the disclosed driver device wraps around the gate region, which is a vertical gate region. The longer channel width associated with the U-shaped channel allows the driver device to be able to provide high conductance and thus lower voltage drop across the device, which is one of the requirements of a memristor driver. The subject technology provides the longer channel width without resulting in a larger planar surface area for each driver device. The current vertical JFET drivers are not seen to have this advantageous feature of the subject technology, which enables the driver device to provide higher conductance at a given drain-source voltage.

The vertical source and drain regions are formed by filling vertical holes etched in the channel region with n+ doped silicon. The vertical source and drain regions may or may not touch the substrate bottom layer. The existing vertical JFETs have totally different structures. For example, the source and drain regions of the existing vertical JFETs are not vertical and parallel to the gate layer, and the channel regions are not U-shaped.

Description of Figures

Figure 1:
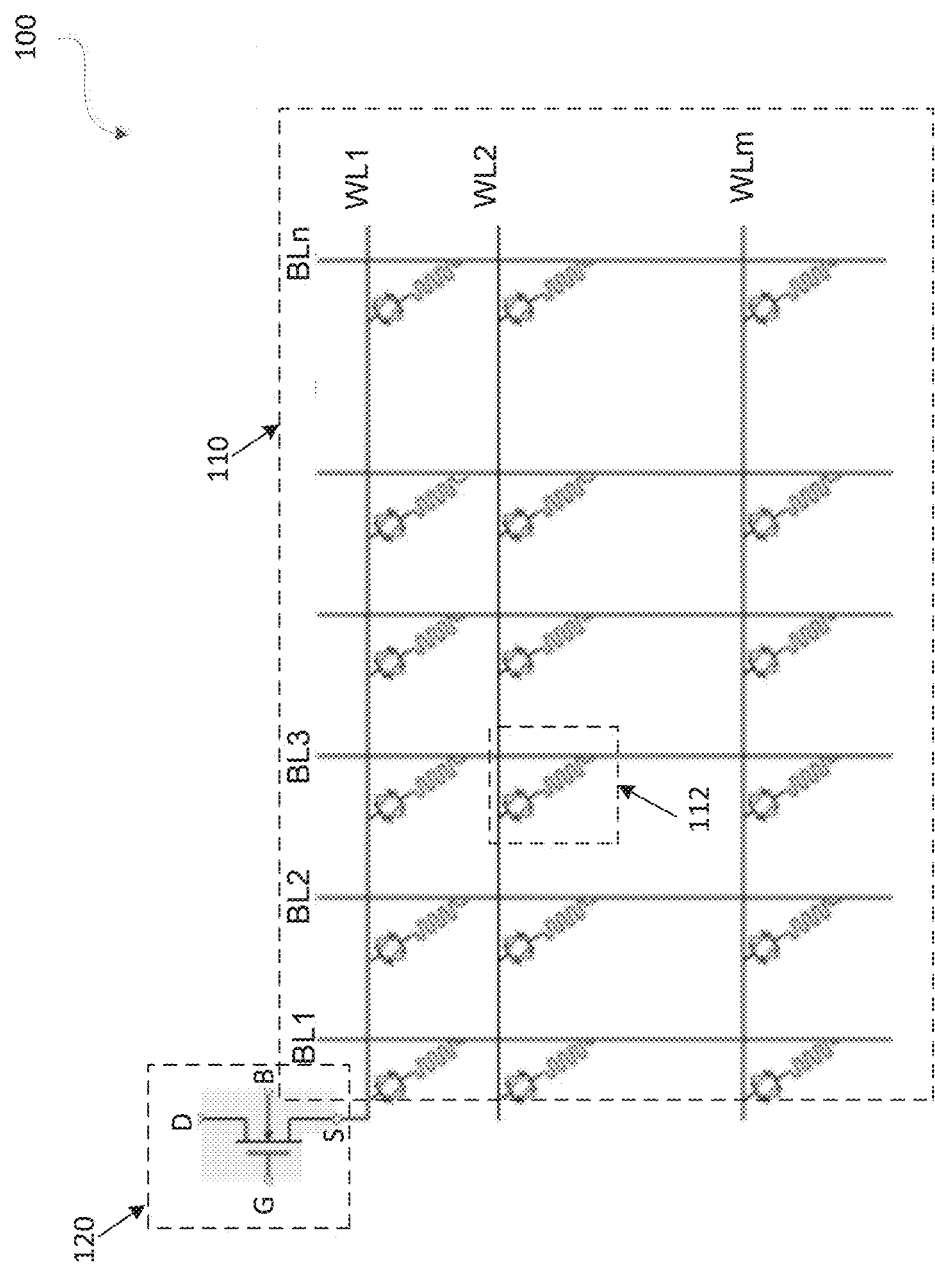
FIG. 1 illustrates a schematic diagram of an example memory system in which the device of the subject technology is used.

FIG. 1 illustrates a schematic diagram of an example memory system 100 in which the device of the subject technology is used. The memory system 100 includes a memristor array 110 and a number of driver devices 120, of which only one is shown for simplicity. The memristor array 110 includes a number of memristor cells 112. Each of the memristor cells 112 includes a memristor element or memristor and a selector element. The memristor cell 112 is connected to a bit-line (e.g., BL3) in one end (terminal) and to a word-line (e.g., WL2) in another end (terminal) of the memristor cells 112. The memristor array 110 may, for example, include n bit-lines (e.g., BL1A, BL2, BL3 ... BLn) and m word-lines (e.g., WL1, WL2 ... WLm). In some implementation, each word-line (e.g., WL1) and each bit-line (e.g., BL1) is connected to a driver device 120. The driver device 120 may also be referred to as a "switch device," a "switch" or a "word-line selector," or a "bit-line selector" as the driver device 120 can cause the memristor cell 112 to switch from one state to another and can also select a specific word-line or bit-line for a read or write operation.

In some implementations, the driver device 120 is a transistor such as a JFET and includes a drain (D), a source (S), a gate (G) and a body (B) node. In some implementations, the source node of the driver device 120 is connected to a respective word-line (e.g. WL1) and bit-line (e.g. BL1). The memristor cell 112 is nonlinear resistor element that can change its state according to a net electric flux or a net charge passing through the cell 112. Memristors are known to save their state after an applied electrical bias is removed. The memristor was first described by Chua in 1971 as the fourth of the two terminal basic passive elements, alongside the resistor (R), capacitor (C), and inductor (L). In a passive implementation, the memristor cell 112 can be a TiO2-based device, although it can be based on different materials.

The driver device 120 has to be able to provide a sufficient switching voltage and current for each memristor cell (e.g., 112). Present transition-metal oxide based realization of memristors can require switching voltages that exceed capabilities of mainstream complementary metal-oxide semiconductor (CMOS) transistors. The voltages and currents required to overcome additional load of the selector and voltage drops across the metal interconnects can further exacerbate the challenge. The driver device (e.g., 120) in the electronics interface circuits are operated at voltages that can significantly exceed the specified bias specifications of standard CMOS processes. Thus transistors with higher voltage tolerances are deployed. Typically, these transistors require thicker gate oxides with accompanying higher threshold voltages and longer channel lengths. The longer channel length multiplied by the channel width can lead into a large planar surface area for each driver device. This can result in areas of the driver devices (e.g., 120) to dominate the overall die density equations and impede realization of full scale potential of memristors, for example, in dot-product engine implementations. The subject technology addresses these challenges by using a vertical JFET to implement the driver device 120, as described in more details herein.

Figure 2:
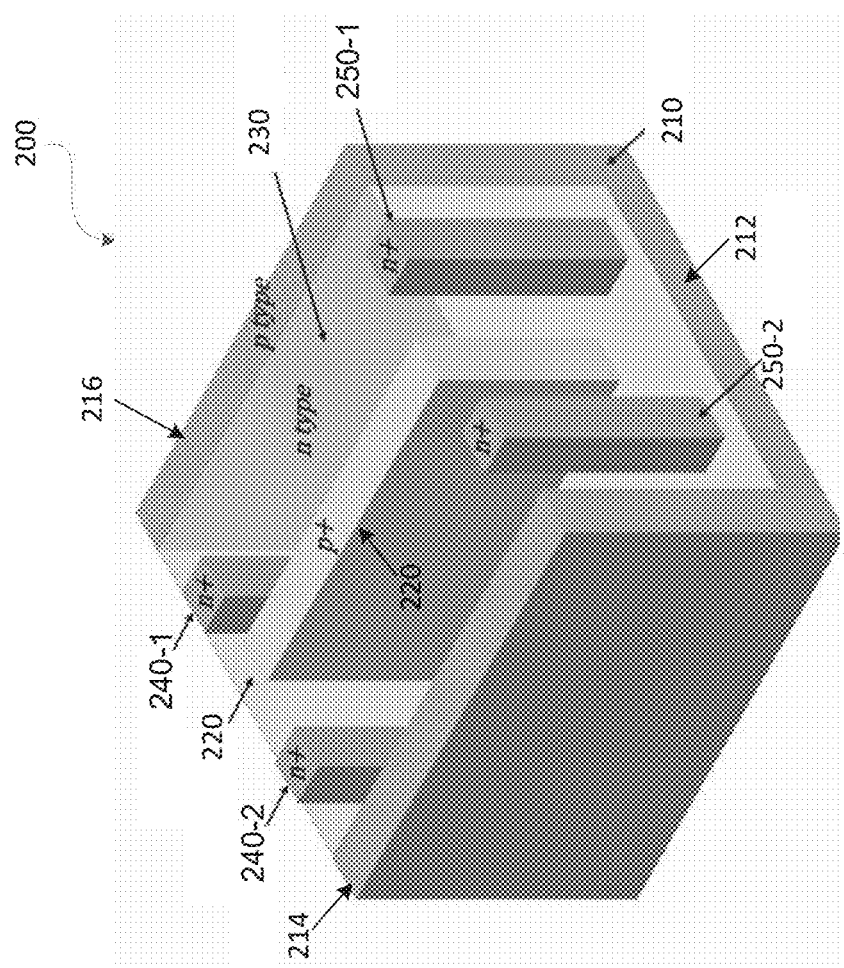
FIG. 2 is a diagram illustrating an example vertical junction field effect transistor (JFET) according to certain aspects of the disclosure.

FIG. 2 is a diagram illustrating an example vertical JFET 200 according to certain aspects of the disclosure. The vertical JFET 200 includes a substrate 210, a vertical gate region 220, source regions 240 (e.g. 240-1 and 240-2), drain regions 250 (e.g., 250-1 and 250-2) and the channel region 230. In some implementations, the substrate 210 can be made of a strained layer of a first semiconductor material, for example, silicon-germanium (Si—Ge). The substrate 210 includes a bottom layer 212, a first wall 214 and a second wall 216. In some implementations, the vertical gate region 220 can be formed of a vertical plate of a p+ doped semiconductor such as silicon. There is a spacing filled with the channel region material between the vertical plate and the bottom layer 212 of the substrate 210. This makes the channel region 230 a U-shape structure that embraces (e.g., wraps around) the vertical gate region 220.

In one or more implementations, the source regions 240 (e.g., 240-1 and 240-2) are formed as columns of, for example, n+ doped silicon (e.g., polysilicon), on both sides of a first end (e.g., left-hand-side end) of the vertical gate region 220. In some implementations, the drain regions 250 (e.g., 250-1 and 250-2) are formed as columns of, for example, n+ doped silicon (e.g., polysilicon), on both sides of a second end (e.g., right-hand-side end) of the vertical gate region 220. The source regions 240 and the drain regions 250 may or may not touch the bottom layer 212 of the substrate 210. In one or more implementations, the number of source regions 240 and the drain regions 250 is not limited to two and can be a suitable number greater than two, for instance, four, six or more. The vertical JFET 200 has the capability to provide sufficient switching voltage and current to drive the memristor 112. The semiconductor real estate consumed by the vertical JFET 200 is significantly (e.g., 10 times) less than a planar transistor based realization.

Figure 3:
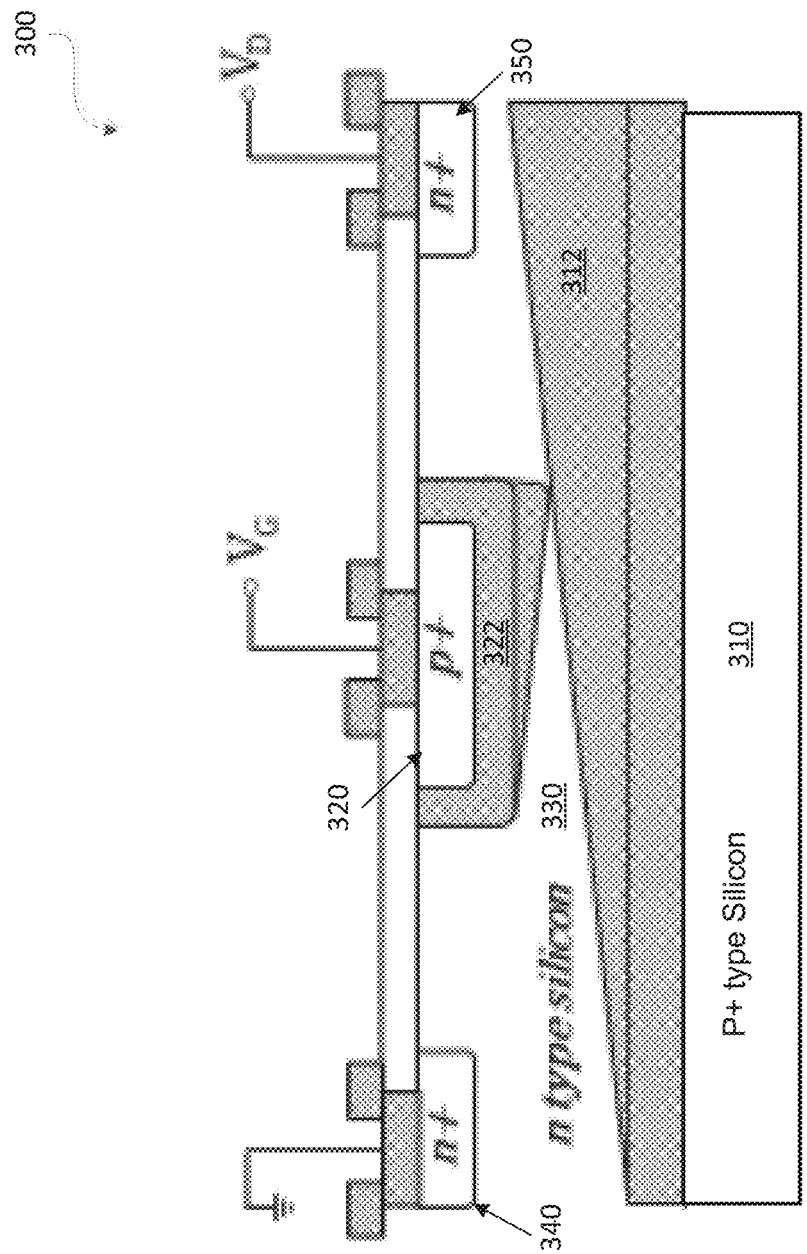
FIG. 3 is a diagram illustrating an example structure of a JFET.

FIG. 3 is a diagram illustrating an example structure of a JFET 300. In a conventional approach a common insulated gate FET (IGFET) may be used as a memristor driver. Implementation of a vertical IGFET of the size and current carrying capacity for memristor driver application could be challenging. Achieving a uniform oxide thickness and control of implant dosage to achieve desired threshold voltages on the sidewalls of deep trenches pose complex and costly manufacturing challenges. To address this fundamental concern, the disclosed solution uses a p-n junction based JFET device. The JFET 300 is a junction based JFET and includes a gate region 320 a source region 340, a drain region 350 and a channel region 330 formed on a substrate 310. The source region 340 is an n+ doped region. The gate region 320 is formed of p+ doped region that can be coupled to a gate bias voltage $V_G$. The drain region 350 is an n+ doped region and can be coupled to a drain bias voltage $V_D$. The positive $V_{DS}$ voltage drop across the channel 330 creates a drain-substrate depletion region 312, which is narrower in the vicinity of the source region 340. In a JFET, the gate bias voltage can be negative or positive. For negative gate bias voltages the JFET channel region 330 may be fully depleted of carriers resulting in no drain to source current flow. For positive gate bias voltages, the depletion layer 322 is reduced in the gate p-n junction and thus enables transport of charged carriers across the channel region from source to drain with high conductance. Increasing the drain bias voltage ($V_D$), can increase the gate depletion region 322 and the substrate p-n junction region 312 near the drain region. At certain $V_D$, the two depletion regions 322 and 312 touch one another, which result in a channel pinch-off. At channel pinch-off the drain current becomes almost constant (saturated) and does not increase with increasing $V_{DS}$ (e.g., by increasing $V_D$). The JFET 300 illustrates a planar device. The disclosed solution is based on a vertical realization of the JFET, the structure and manufacturing steps of which are described in more detail below.

Figure 4:
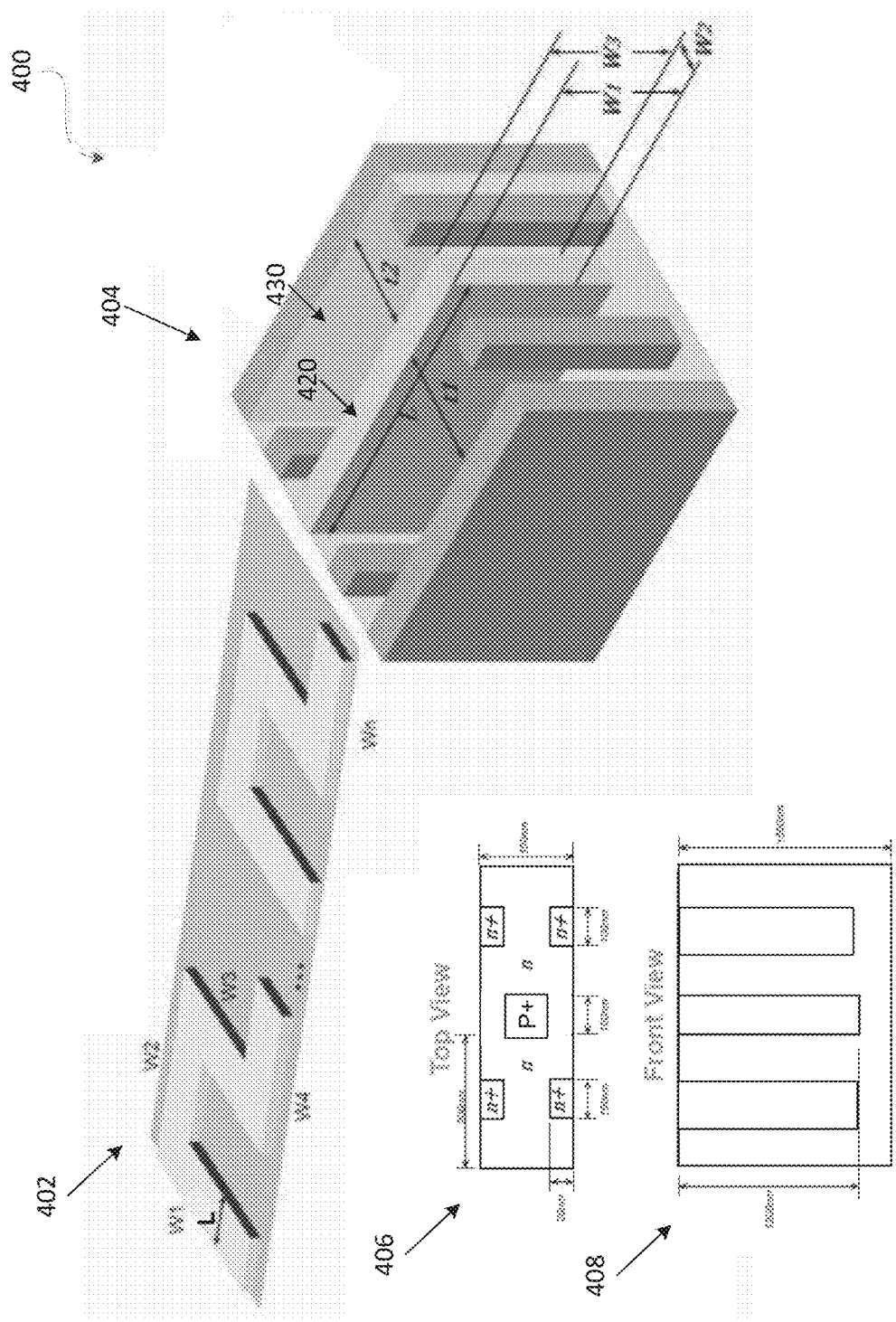
FIG. 4 is a diagram illustrating a planar density effect of an example vertical JFET of the subject technology.

FIG. 4 is a diagram illustrating a planar density effect of an example vertical JFET of the subject technology. The diagram shown in FIG. 4 illustrates a comparison between a planar IGFET structure 402, which is a standard CMOS n-channel transistor, and a vertical JFET structure 404 of the subject technology. In this comparison, it is reasonable to consider, for example, a semiconductor process of 22 nm feature size. In such an instance, critical dimensions such as the channel length (L) of 100 mm the depletion region thickness (t1, t2) of 200 nm each and width (W1, W3) of 1 μm each can be implemented. Based on these conservative example dimensions, the planar footprint area of such a device would equal about 0.05 μm² which would represent a substantial reduction (e.g., about 1/10$^{th}$) in the chip area as compared with the planar IGFET structure 402.

The top and side views 406 and 408 show example relevant dimensions and distances of the vertical JFET including n+ source and drain regions and a p+ gate region. The vertical JFET device of the subject technology can be operated in the linear region when utilized as a driver transistor for memristor arrays. In this case bias condition, the n-region would be undepleted and the channel current can effectively be a metallurgical channel current which is proportional to (W/L), where W=W1+W2+W3.

Figure 5A:
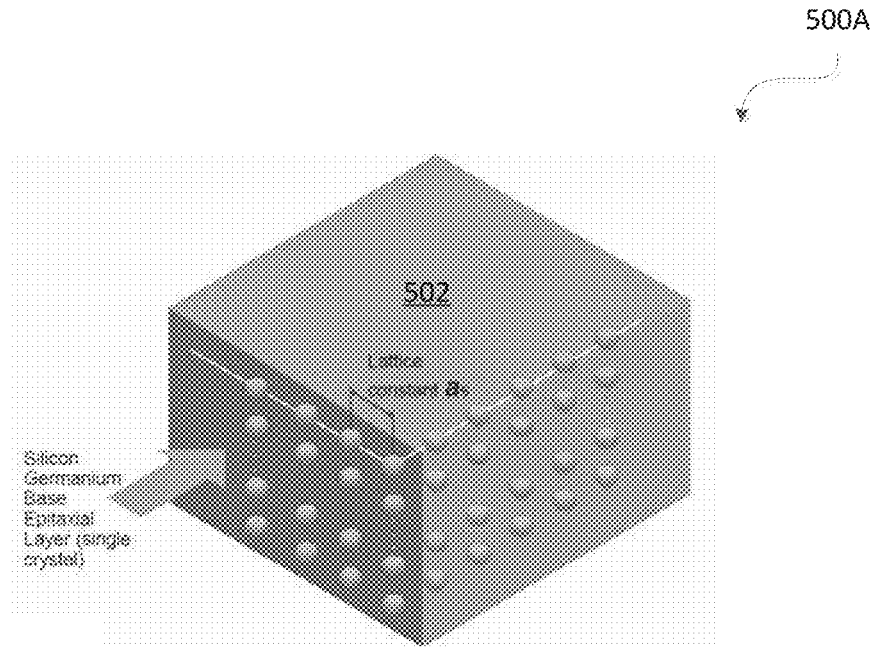
FIGS. 5A-5B are diagrams illustrating example structures depicting a strained substrate and a channel region formed in a well of the substrate according to certain aspects of the disclosure.
Figure 5B:
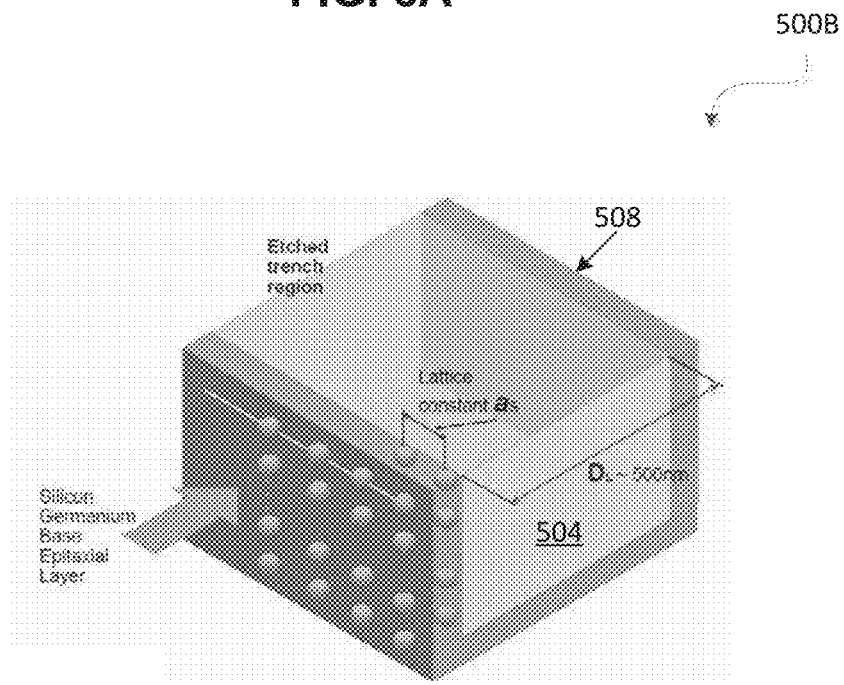

FIGS. 5A-5B are diagrams illustrating example structures 500A and 500B depicting a strained substrate and a channel region formed in a well of the substrate according to certain aspects of the disclosure. It is understood that the channel region of vertical JFET device of the subject technology can be fabricated by epitaxial growth of silicon that represents a doped, high-quality, single-crystal. The mobility in such a device would be proportional to the number of dopants enhancing the carrier concentration. This contrasts with the other possibility of compensated conduction channel material where implant and diffusion degrade the mobility by a factor proportional to the total number of dopants, $N_d+N_a$. The resultant compensated material fabricated to achieve carrier concentrations can result in higher probability of scattering. The subject technology achieves improvements in channel conductance of the vertical JFET, for example, by using epitaxial growth techniques that result in strained JFET conduction channel material. Use of crystal silicon-germanium, as shown in the structure 500A, as a substrate layer 502 can provide the material stack framework In the disclosed vertical JFET device electronic transport can take place along the entire depth of the device. This is in contrast to the conventional IGFET devices, where the transportation is entirely along the planar surface below the gate region. The lattice constant ($a_s$) of silicon-germanium substrate layer 502 is expanded compared to that of crystal silicon. In addition to mismatch for epitaxial deposition on the planar surface above the substrate layer 502, the strained silicon vertical JFET conduction channel 504 is grown adjacent to the vertical wall 508 of the etched trench region 506 of the structure 500B.

Figure 6A:
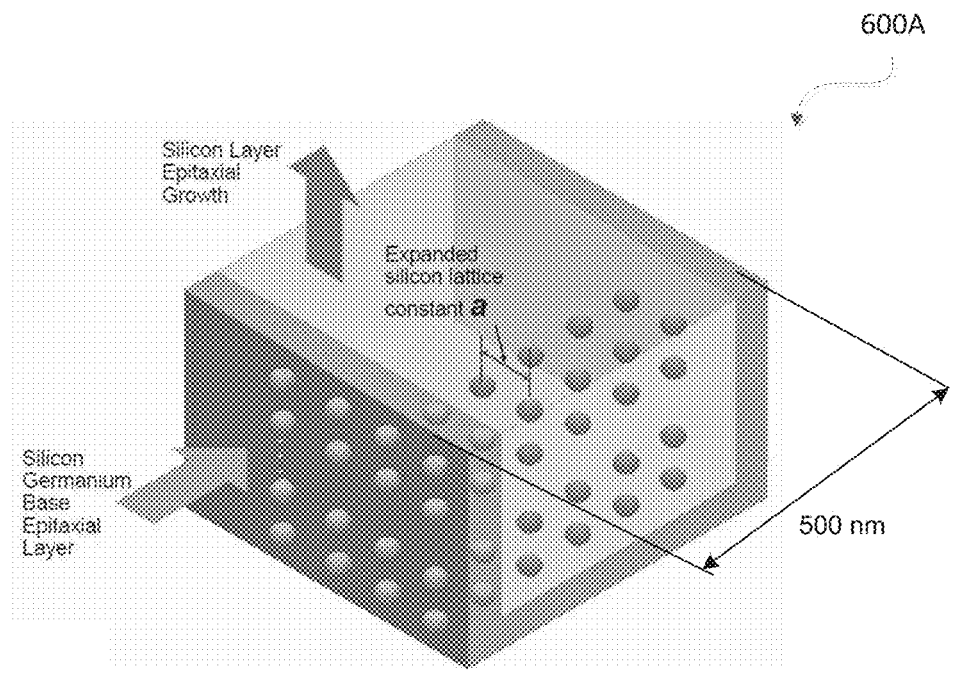
FIGS. 6A-6B illustrate an example process of forming a well in a strained substrate and fabricating a channel region in the well according to certain aspects of the disclosure.
Figure 6B:
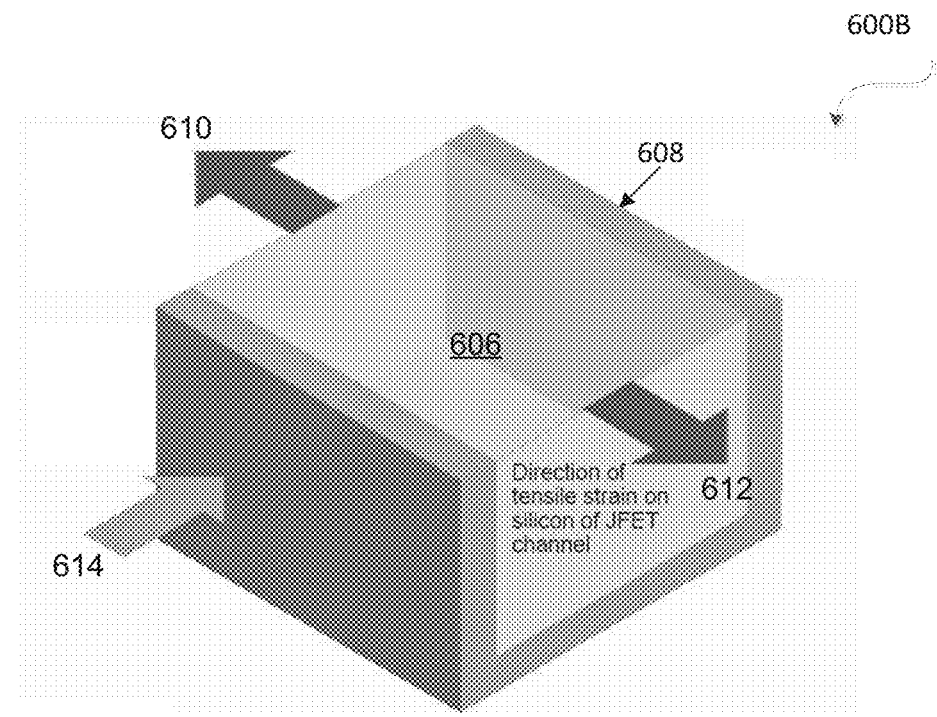

FIGS. 6A-6B illustrate an example process of forming a well in a substrate and fabricating a channel region in the well according to certain aspects of the disclosure. Growth of strained crystal material adjacent to material of larger lattice constant is constrained. Specifically, the thickness of strained material cannot exceed a predefined thickness in order to avoid introduction of defects and dislocations. In some implementations, a width of the vertical JFET device of the subject technology, as depicted in FIG. 6A, is on the order of 500 nm, which is a typical thickness of such defect free strained silicon grown layers. Following the etching step to create the trench, the crystal silicon channel region 606 is grown with strain emanating from the mismatch with silicon-germanium sidewalls 608, as shown in FIG. 6B.

Figure 7:
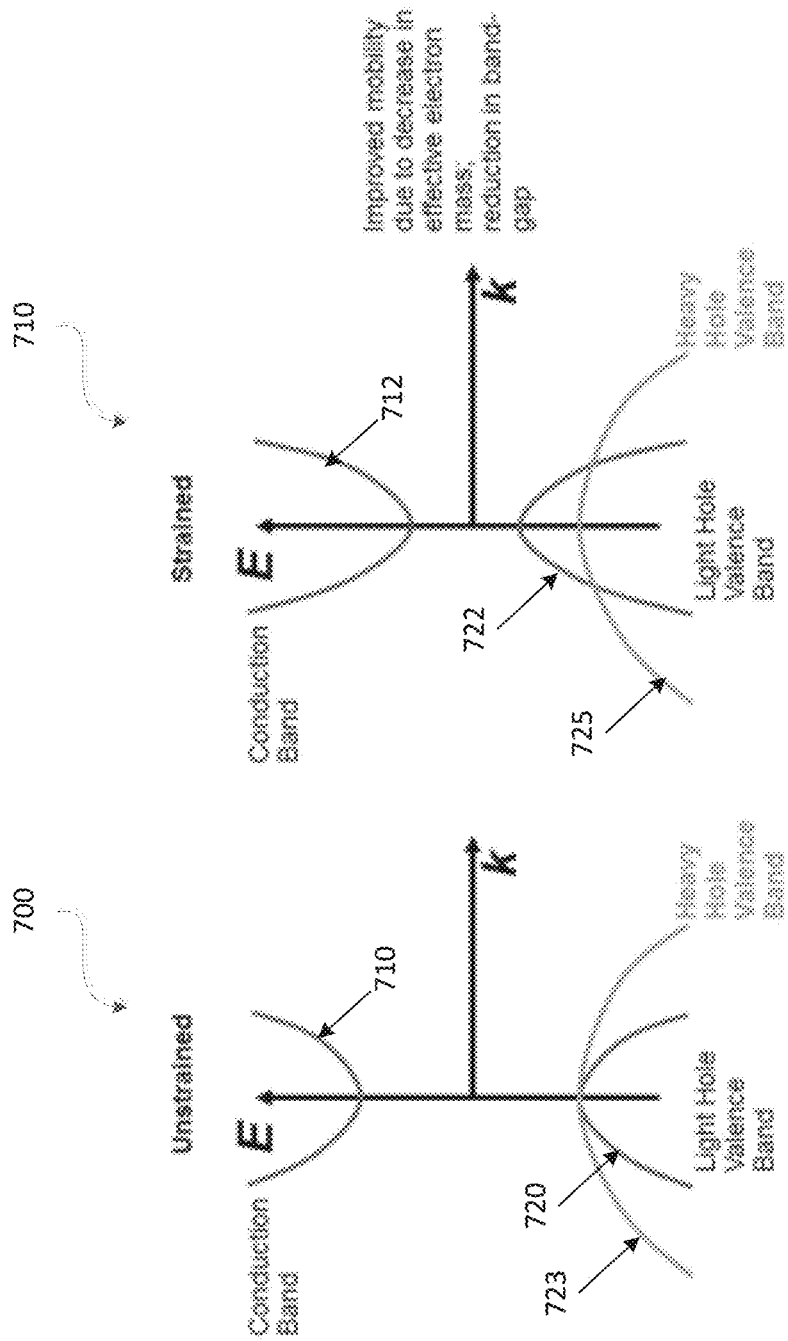
FIG. 7 is a diagram illustrating plots depicting effect of strain on conduction band and valence band structures of a JFET of the subject technology.

FIG. 7 is a diagram illustrating plots 700 and 710 depicting effect of strain on conduction band and valence band structures of a JFET of the subject technology. The plot 700 is an energy versus K-parameter plot for an unstrained crystal and includes a conduction band 710 and valence bands 720 and 723. The valence band 720 is a light hole valence band and the valence band 723 is a heavy hole valence band. The plot 710 is a similar plot for a strained crystal and includes a conduction band 712 and valence bands 722 and 725. The valence band 722 is a light hole valence band and the valence band 725 is a heavy hole valence band. The comparison of the plots 700 and 710 indicates that when the mechanical tensile strain upon crystal silicon has been utilized to improve electronic transport in devices, the pseudo morphed material produced can modify the band structure of the material. The modification of the band structure includes narrowing the bandgap between the conduction band and the valence bands and a decrease in an effective electron mass resulting in improved electron mobility.

Figure 8:
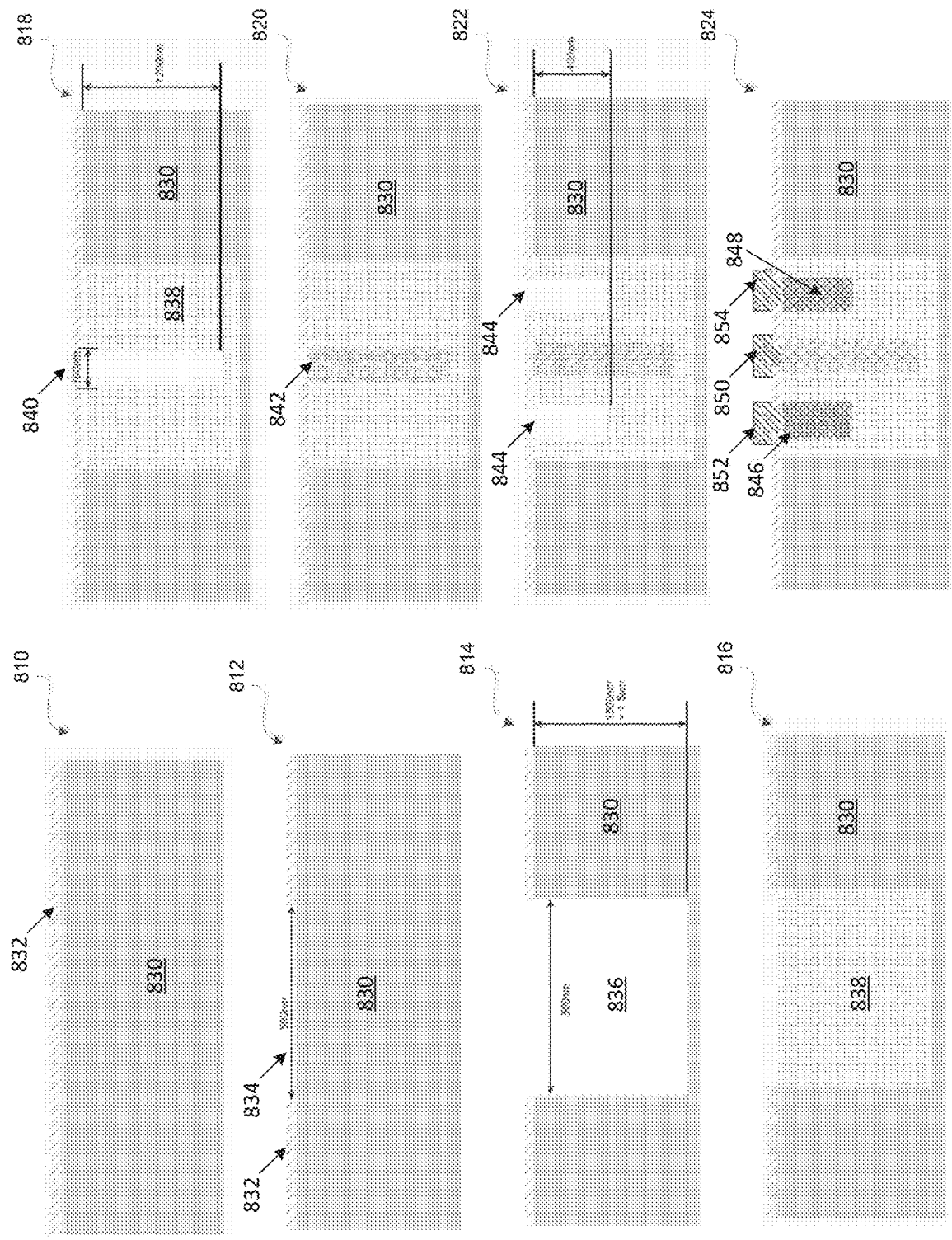
FIG. 8 is a process flow diagram illustrating example manufacturing steps of a vertical JFET according to certain aspects of the disclosure.

FIG. 8 is a process flow diagram illustrating example manufacturing steps 810, 812, 814, 816, 818, 820, 822 and 824 of a vertical HET according to certain aspects of the disclosure. In a first step 810, a silicon dioxide layer 832 is grown over a substrate 830. The following step 812 is a patterned removal step of the silicon dioxide layer 832 to create an opening 834. A mask patterning is used to create the opening 834 with an example width of about 500 nm. The silicon dioxide layer 832 can be removed by a plasma assisted etch process to enable high selectivity etching of the silicon dioxide layer 832. The step 814 includes creating a trench 836 with a depth of about 1500 nm in the substrate 830. The trench 830 can, for example, be created by using a plasma assisted etching process, which is highly anisotropic and selective etch with negligible lateral etch rate. An aspect ratio (width-to-depth) of trench 830 can be about 1:15, and wet chemical cleaning process can be used to remove contaminants at bottom of the trench 830. The next step 816 including filing the trench 830 with an epitaxially grown layer 838. The epitaxially grown layer 838 can be a highly doped n-type silicon and can be deposited by using a chemical vapor deposition (CVD) technique. The step 816 can further include removal of surface oxide and any residual material on oxide surface after epitaxial growth and regrowth of surface oxide and patterning for the subsequent step. The subsequent step 818 is for creating a trench 840 in the epitaxially grown layer 838, which can be performed, for example, by using a deep reactive etching such as the Bosch process, which entails several iterations of a number of processes including a highly isotropic plasma etch, forming a chemically inert passivation layer and directional ions bombardment at the bottom of the trench. An aspect ratio (width-to-depth) of the resultant trench 840 can be about 1:12. In the step 820, the trench 840 is filled with a p+ type polysilicon, which can be deposited using a molecular beam epitaxy based deposition to build the gate region 842.

In a next step 822, trenches 844 are created using the same process as used in the step 818. The final step 824 includes filing the tranches 844 with n+ type polysilicon using the molecular beam epitaxy based deposition to build a source region 846 and a drain region 848. The final step 824 further includes creating gate, source and drain metal contacts 850, 852 and 854, respectively, by using a physical vapor deposition process.

Figure 9:
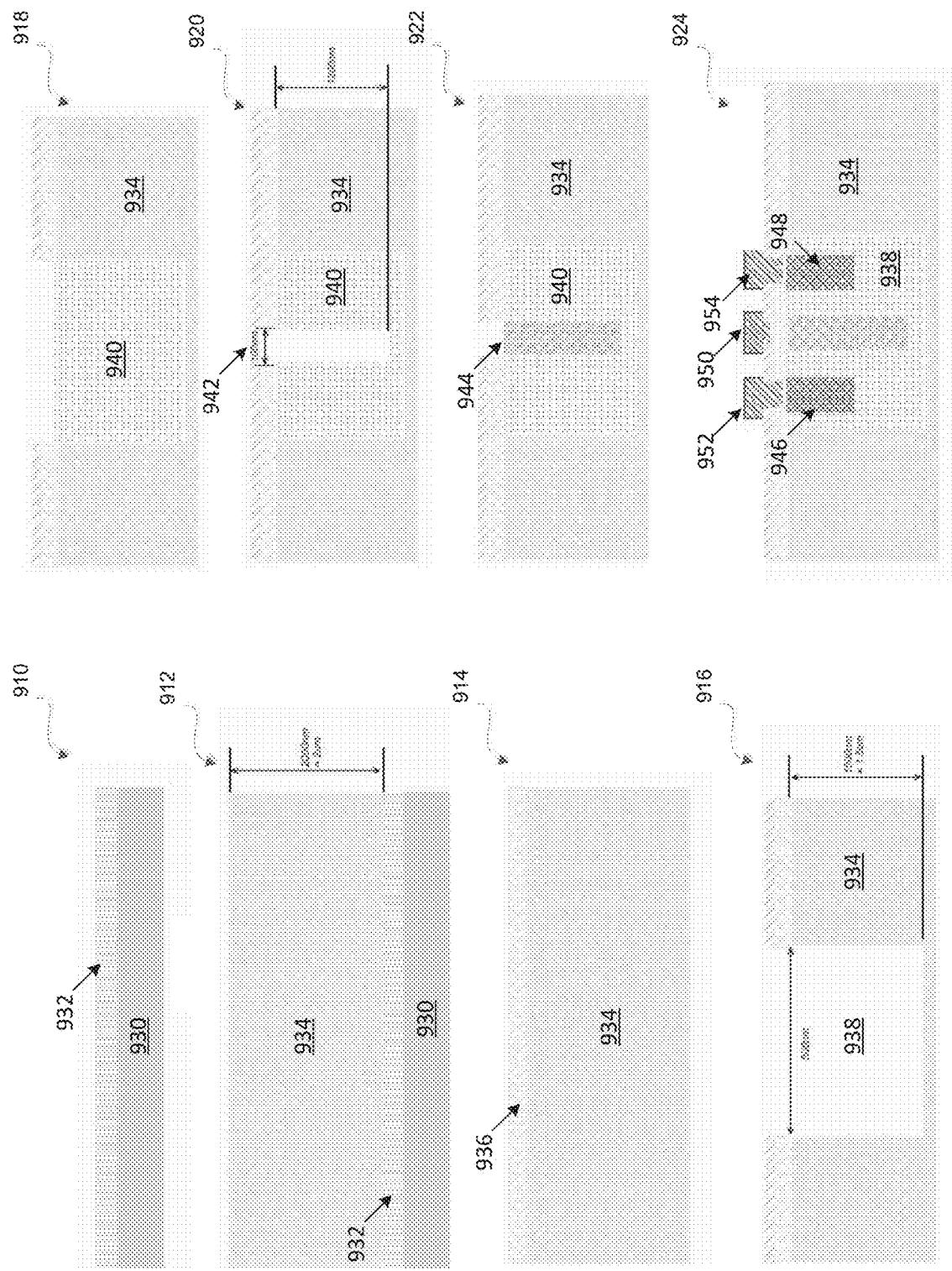
FIG. 9 is a process flow diagram illustrating example manufacturing steps of a vertical JFET according to certain aspects of the disclosure.

FIG. 9 is a process flow diagram illustrating example manufacturing steps 910, 912, 914, 916, 918, 920, 922 and 924 of a vertical JFET according to certain aspects of the disclosure. The steps of the process flow diagram of FIG. 9 are for fabrication of a performance vertical JFET device. In the Step 910, a fully relaxed graded layer of silicon germa-nium ($Si_xGe_{1-x}$) 932 is formed on a substrate 930. The deposition of the layer 932 is performed by molecular beam epitaxy based deposition to optimize the buffer layer. A chemical-mechanical polishing step may be performed to achieve low threading dislocation density of subsequent Ge epitaxial growth layer. In the next step 912 a CVD process is used to grow a germanium epitaxy growth layer 934 with a thickness of about 2000 nm. In a subsequent step 914, using a CVD technique, a polysilicon layer 936 is deposited on the Ge epitaxial growth layer. In the step 916, following suitable patterning a plasma assisted etch technique is used to create a trench 938. The process step 916 is similar to the process step 814 of FIG. 8. In the step 918, using a CVD process, an epitaxial growth 940 of strained silicon in germanium epitaxy is performed. The step 918 can further include removal of surface oxide and any residual material on oxide surface after epitaxial growth and regrowth of surface oxide and patterning for the subsequent step. The next step 920 is the step of etching a deep trench 942, of a depth of about 1200 nm, for gate deposition and is performed similar to the step 818 of FIG. 8. The subsequent step 922 includes deposition of a gate p+ type deposition 944 and is performed similar to step 820 of FIG. 8. Further, the steps 924 and 926 are similar to the steps 822 and 824 of FIG. 8 and are used to create a gate region 944, a source region 946, a drain region 948, a gate metal contact 950 and source and drain metal contacts 952 and 954.

Figure 10:
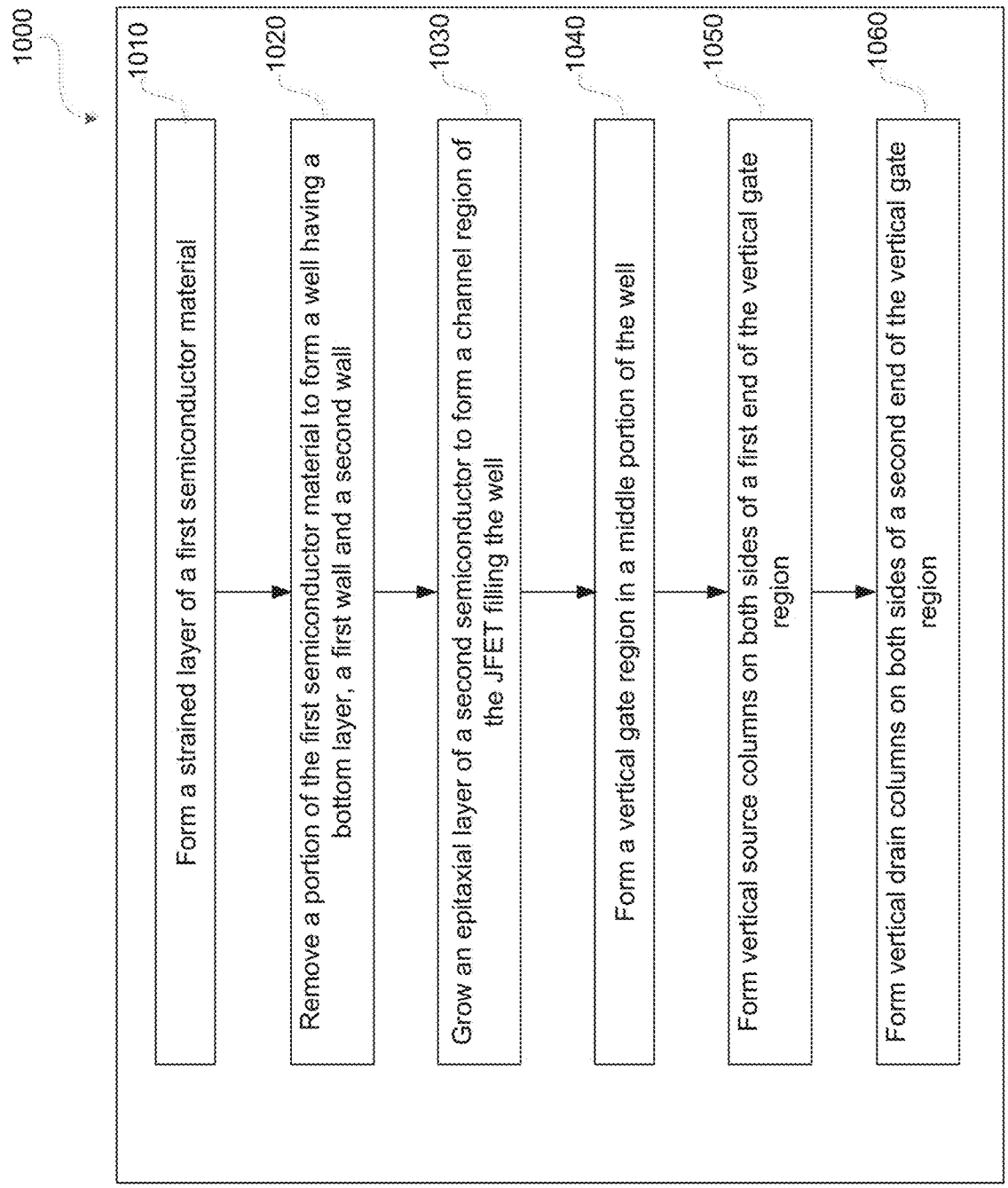
FIG. 10 is a flow diagram illustrating an example method of processing a vertical JFET according to certain aspects of the disclosure.

FIG. 10 is a flow diagram illustrating an example method 1000 of processing a (JFET according to certain aspects of the disclosure. The method 1000 includes forming a strained layer of a first semiconductor material (e.g., 210 of FIG. 2) (1010). The method further includes removing a portion of the first semiconductor material to form a well (e.g., 606 of FIG. 6B) having a bottom layer (e.g., 212 of FIG. 2), a first wall (e.g., 214 of FIG. 2), and a second wall (e.g., 214 of FIG. 2) (1020). An epitaxial layer of a second semiconductor is grown to form a channel region (e.g., 230 of FIG. 2) (1030). A vertical gate region (e.g., 220 of FIG. 2) is formed in a middle portion of the well (1040). Vertical source columns (e.g., 240 of FIG. 2) are formed on both sides of a first end of the vertical gate region (1050), and vertical drain columns (e.g., 250 of FIG. 2) are formed on both sides of a second end of the vertical gate region (1060). Forming the vertical gate region includes forming a vertical plate having a height less than a depth of the well and leaving a layer of channel region between the vertical gate region and the bottom layer.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

As used herein, the phrase "at least one" of preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for".

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A device for driving a memristor array, the device comprising:
    a substrate including a well having a bottom layer, a first wall and a second wall, the substrate formed of a strained layer of a first semiconductor material; and
    a vertical junction field-effect transistor (JFET) formed in the well, the vertical JFET comprising:
    a vertical gate region formed in a middle portion of the well with a gate region height less than a depth of the well;
    a channel region formed of a second semiconductor wrapped around the vertical gate region;
    vertical source regions formed on both sides of a first end of the vertical gate region; and
    vertical drain regions formed on both sides of a second end of the vertical gate region.

2. The device of claim 1, wherein the first semiconductor material comprises a silicon-germanium material.

3. The device of claim 1, wherein the vertical gate region comprises a p+ doped polysilicon material.

4. The device of claim 1, wherein the channel region is a U-shaped epitaxial layer and extends under the vertical gate region.

5. The device of claim 1, wherein the vertical gate region comprises a vertical plate parallel to the first wall and the second wall.

6. The device of claim 1, wherein the vertical source regions comprises two or more columns of an n+ doped polysilicon parallel to the vertical gate region.

7. The device of claim 1, wherein the vertical drain regions comprises two or more columns of an n+ doped polysilicon parallel to the vertical gate region.

8. An apparatus comprising:
a memristor array comprising a plurality of memristor elements arranged in rows and columns; and
a plurality of driver devices configured to switch the plurality of memristor elements, each driver device comprising a vertical junction field-effect transistor (JFET),
wherein the vertical JFET comprises:
a vertical gate region formed within a well and having a gate region height less than a depth of the well;
a channel region formed of a U-shaped epitaxial layer of a second semiconductor wrapped around the vertical gate region;
vertical source regions formed on both sides of a first end of the vertical gate region; and
vertical drain regions formed on both sides of a second end of the vertical gate region.

9. The apparatus of claim 8, wherein the vertical JFET is embedded in a U-shape substrate having a bottom layer, a first wall and a second wall formed of a strained silicon-germanium growth.

10. The apparatus of claim 8, wherein a first wall and a second wall are formed of a strained silicon-germanium growth.

11. The apparatus of claim 8, wherein the vertical gate regions comprises a plate parallel to the first wall and the second wall and comprises a p+ doped polysilicon material.

12. The apparatus of claim 8, wherein each of the vertical source regions and the vertical drain regions comprises a column of an n+ doped polysilicon parallel to the vertical gate region.

* * * * *